(12) United States Patent
Leobandung

(10) Patent No.: US 9,455,347 B1
(45) Date of Patent: Sep. 27, 2016

(54) MANDREL REMOVAL LAST IN LATERAL SEMICONDUCTOR GROWTH AND STRUCTURE FOR SAME

(71) Applicant: INTERNATIONAL BUSINESS MACHINES CORPORATION, Armonk, NY (US)

(72) Inventor: Effendi Leobandung, Stormville, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 14/959,046

(22) Filed: Dec. 4, 2015

(51) Int. Cl.
*H01L 21/8238* (2006.01)
*H01L 29/78* (2006.01)
*H01L 29/66* (2006.01)
*H01L 29/267* (2006.01)
*H01L 29/06* (2006.01)

(52) U.S. Cl.
CPC ....... *H01L 29/7848* (2013.01); *H01L 29/0649* (2013.01); *H01L 29/267* (2013.01); *H01L 29/6681* (2013.01); *H01L 29/66545* (2013.01); *H01L 29/785* (2013.01)

(58) Field of Classification Search
CPC ................ H01L 21/823431; H01L 27/10879; H01L 29/66795
See application file for complete search history.

(56) References Cited

U.S. PATENT DOCUMENTS

| | | | | |
|---|---|---|---|---|
| 2014/0327044 | A1* | 11/2014 | Leobandung | H01L 29/66795 257/192 |
| 2014/0357034 | A1* | 12/2014 | Cheng | H01L 29/785 438/275 |
| 2016/0071846 | A1* | 3/2016 | Wen | H01L 27/0886 257/401 |

* cited by examiner

*Primary Examiner* — Thomas L Dickey
(74) *Attorney, Agent, or Firm* — Cantor Colburn LLP; Louis Percello

(57) ABSTRACT

A method of forming a semiconductor structure is disclosed comprising removing mandrel elements, the side walls of which support semiconductor fin structures, which mandrel elements are formed by removing portions of each of a plurality of elongated mandrels outside sacrificial gate structures, wherein the mandrel elements are removed after removing the sacrificial gate structure. Also disclosed is an intermediate semiconductor structure, obtained during some embodiments of the method, comprising a plurality of mandrel elements, a plurality of fin channel structures, source regions and drain regions on opposing sides of the fin channel structures wherein the bottom most surface of the fin channel structures and the source and drain regions are in direct physical contact with a common dielectric layer on a silicon-containing substrate.

16 Claims, 14 Drawing Sheets

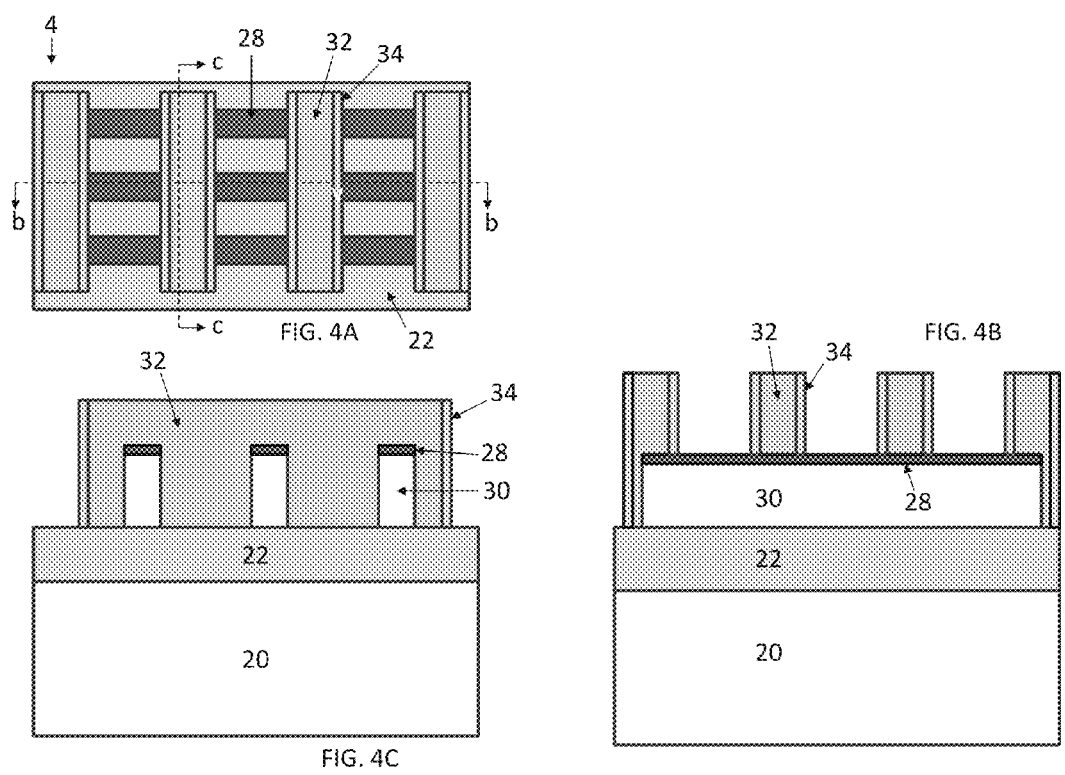

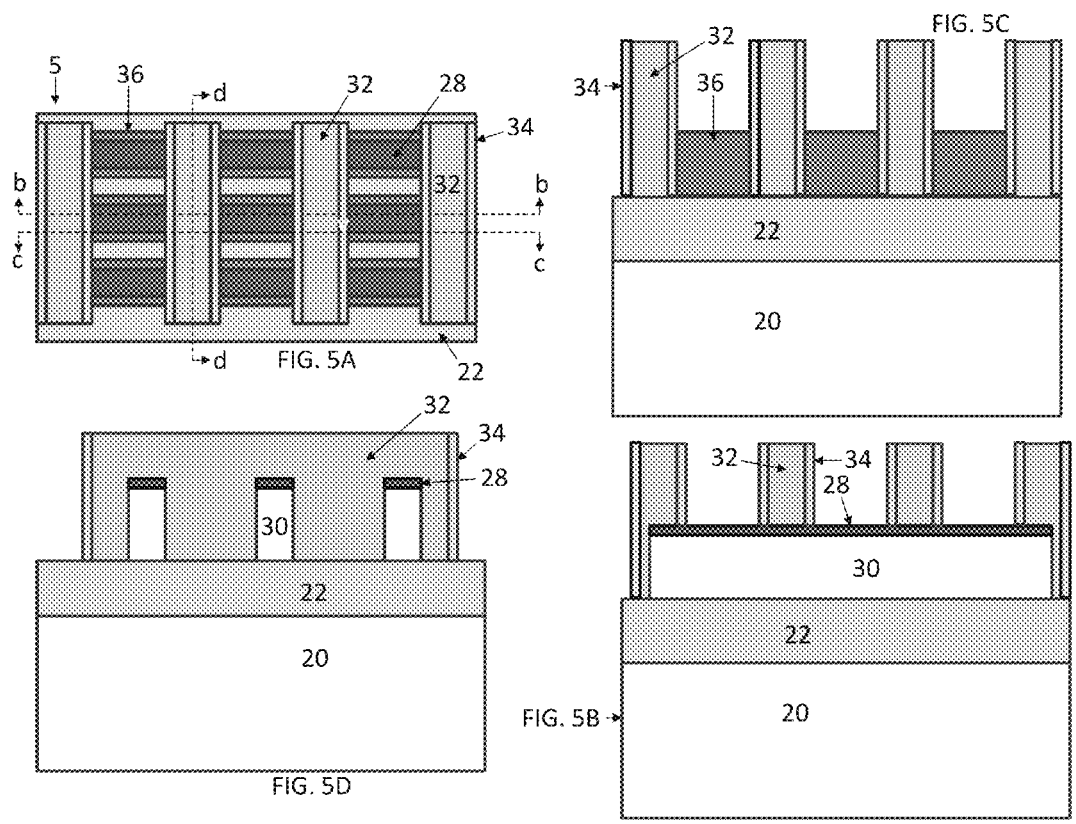

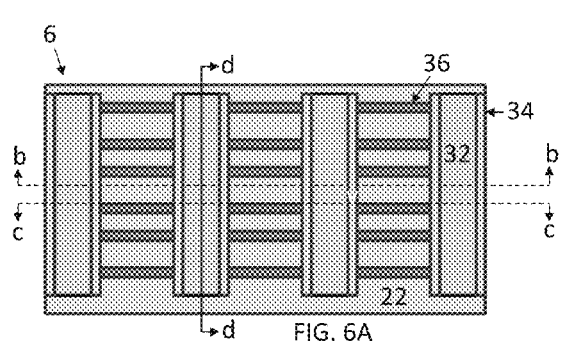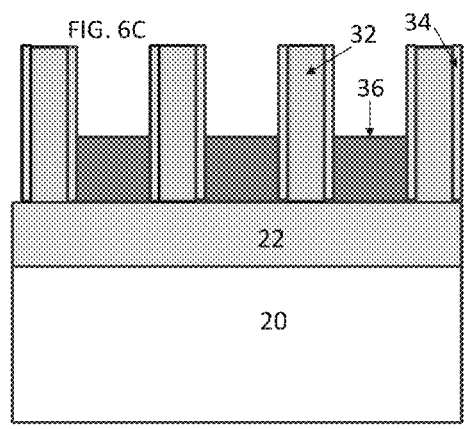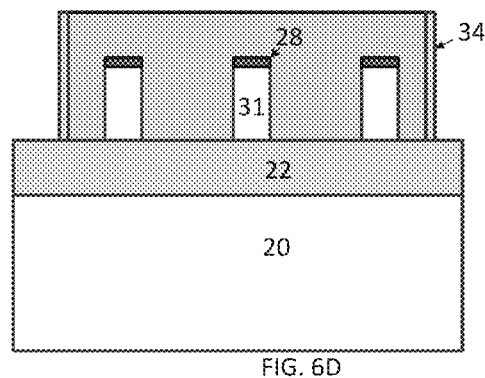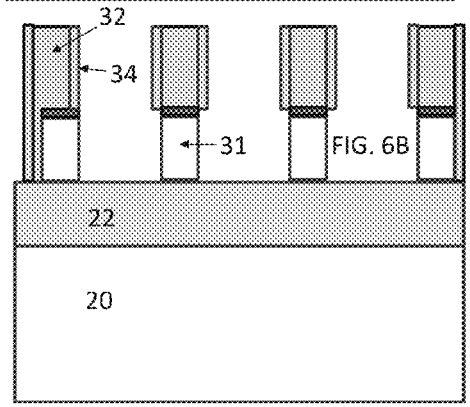

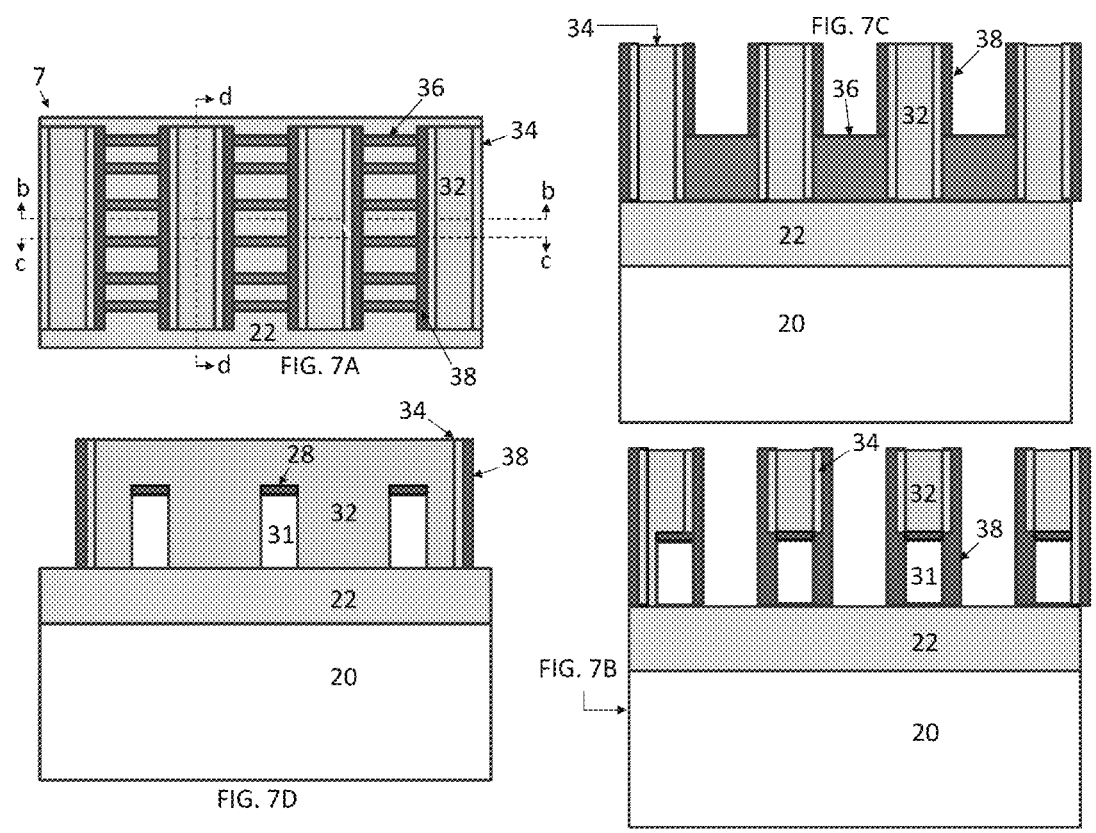

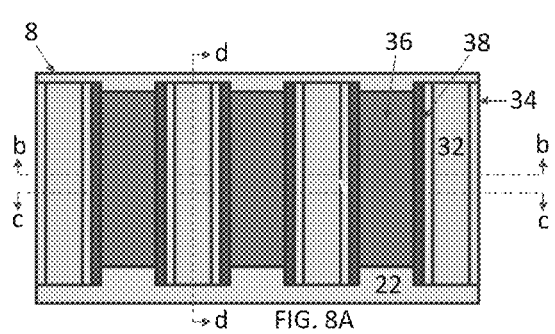
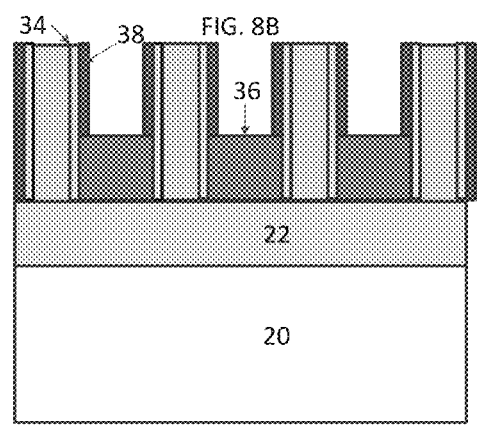
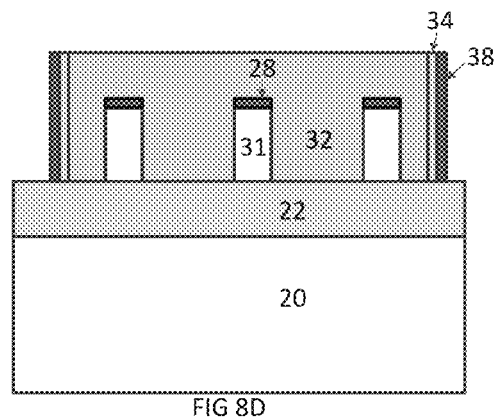
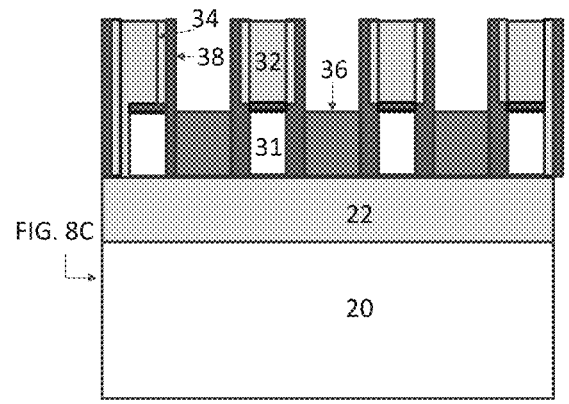

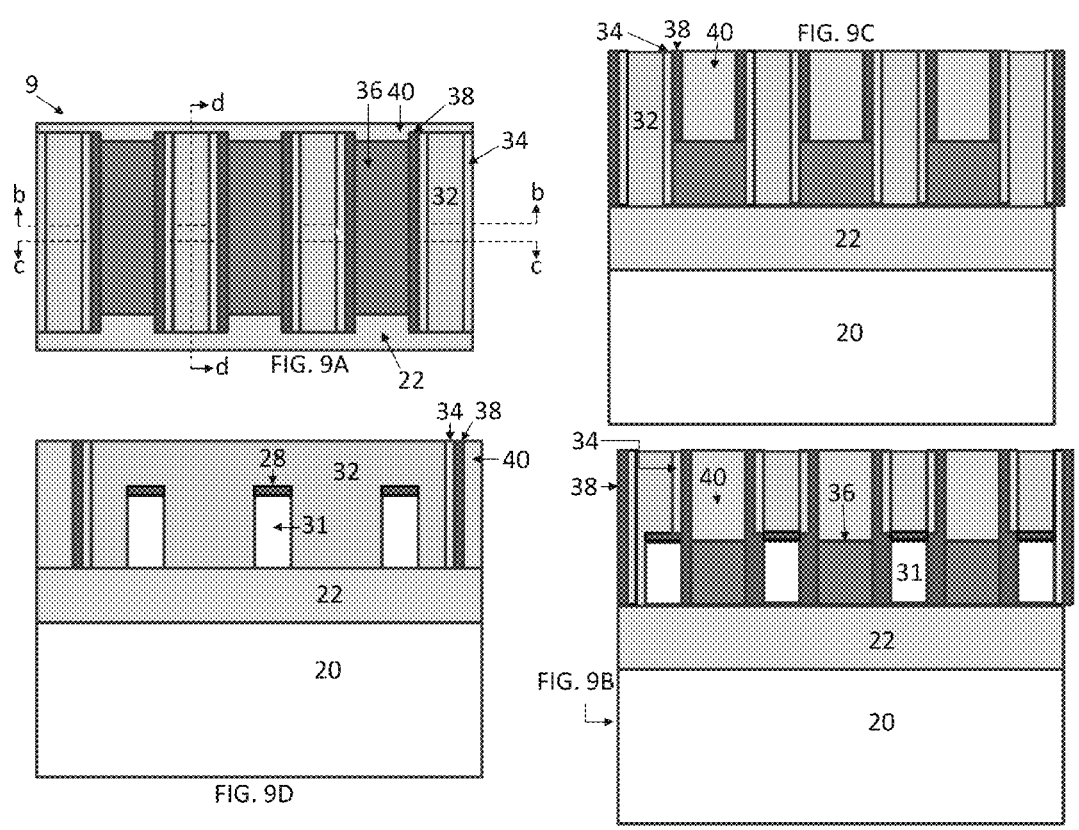

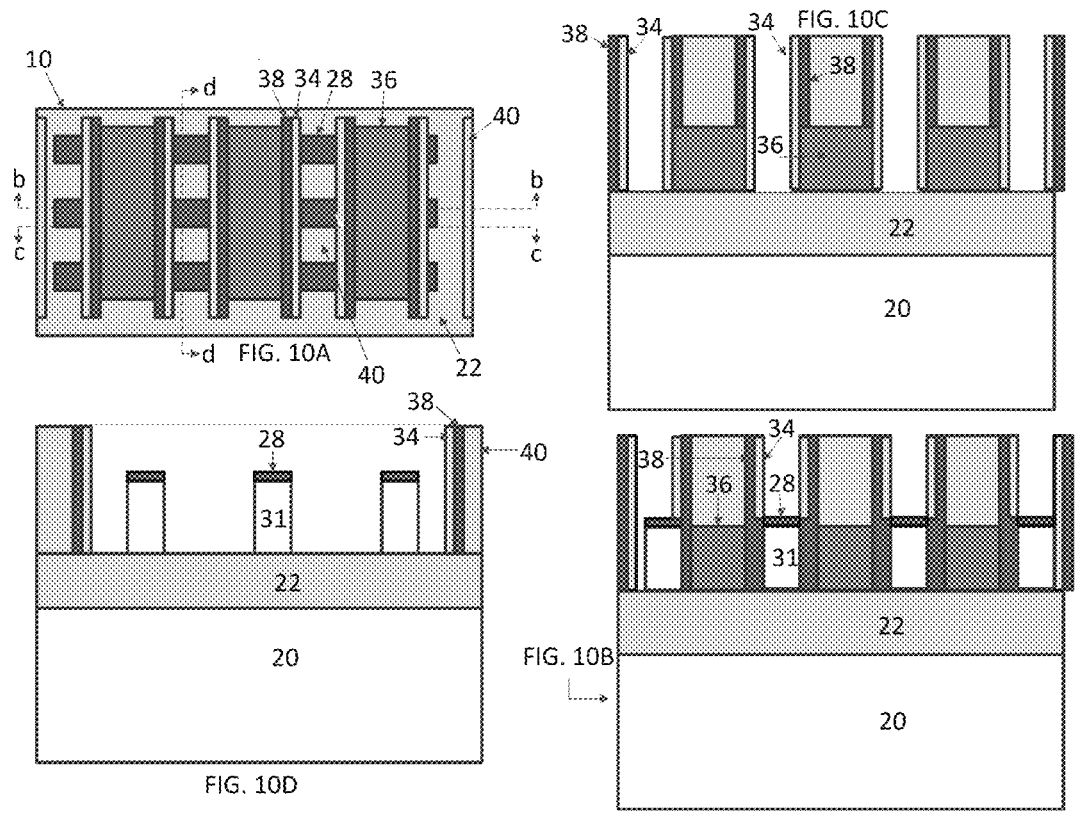

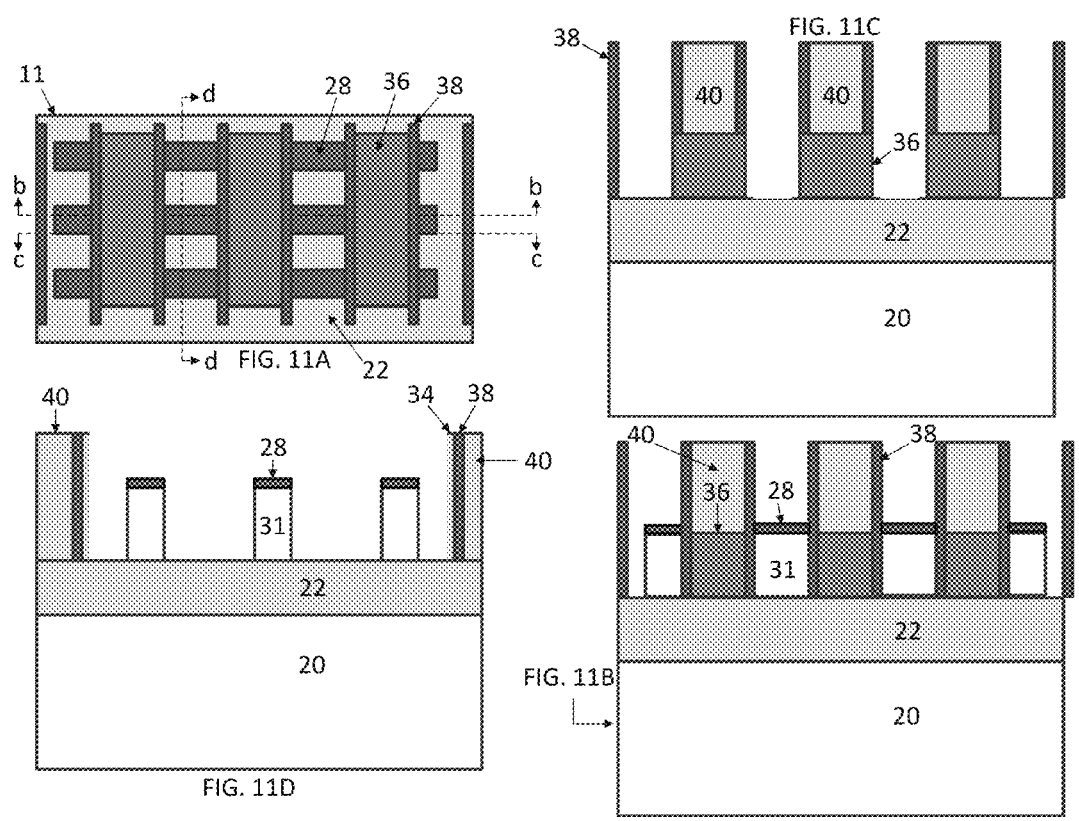

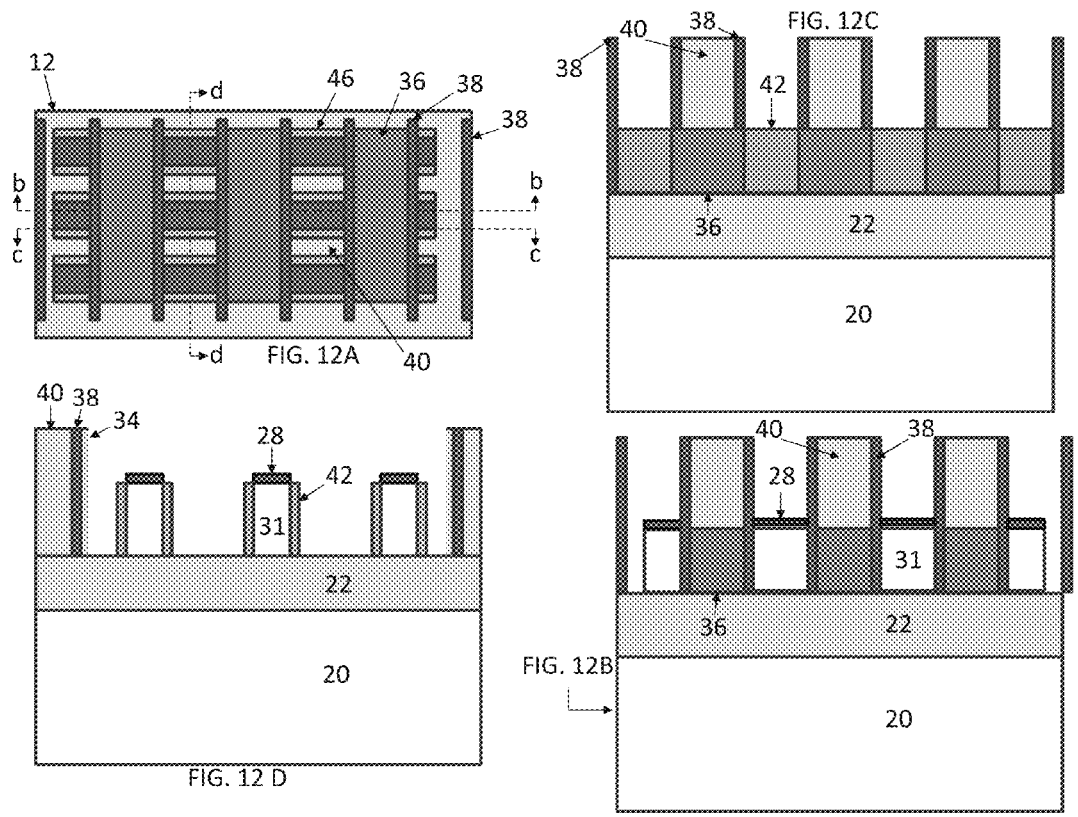

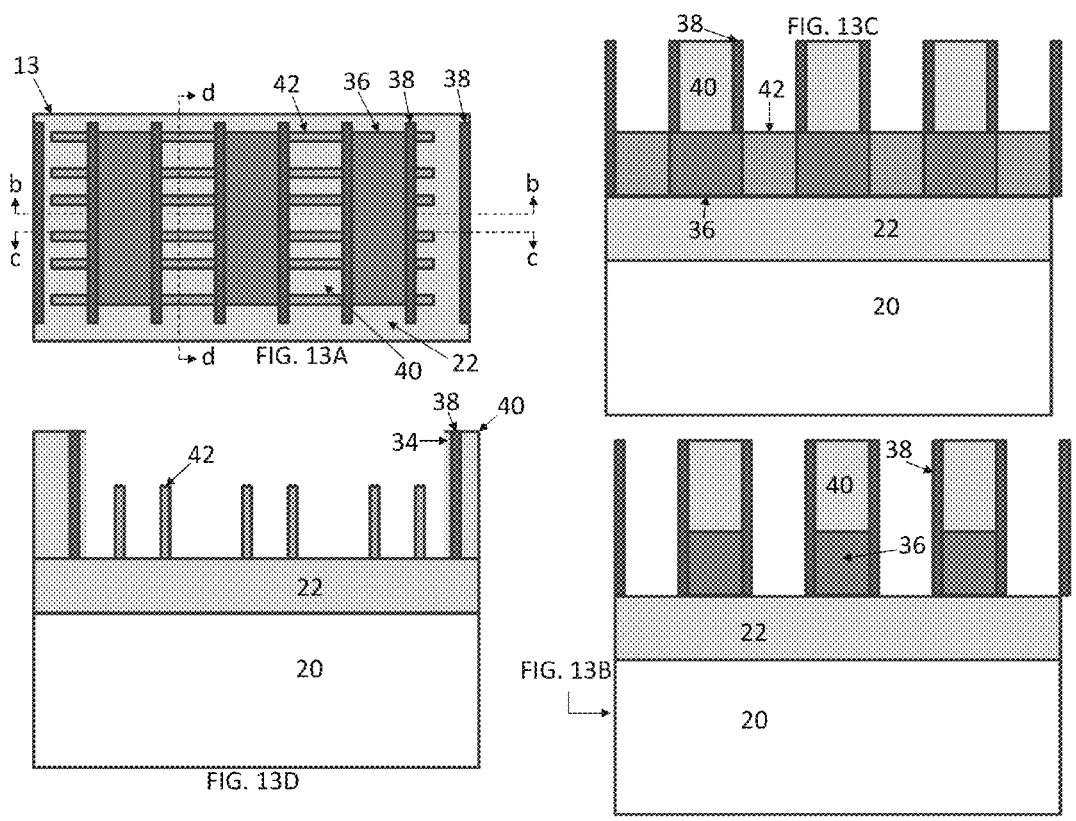

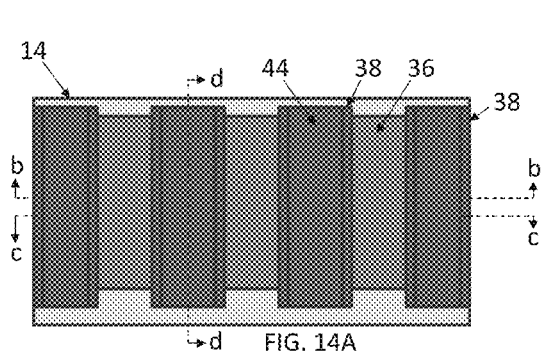
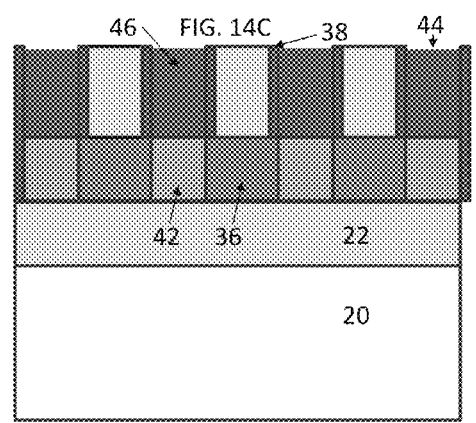
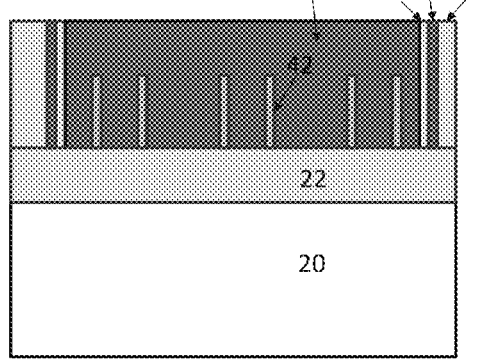
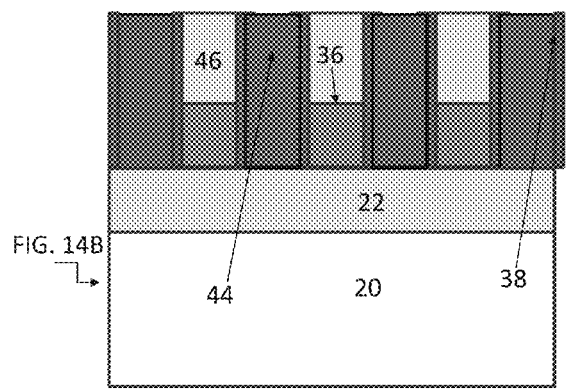
FIG. 14A
FIG. 14C
FIG. 14D
FIG. 14B

US 9,455,347 B1

MANDREL REMOVAL LAST IN LATERAL SEMICONDUCTOR GROWTH AND STRUCTURE FOR SAME

BACKGROUND

The present disclosure relates generally to semiconductor devices. More particularly, the present disclosure relates to semiconductor devices having a fin structure. In particular, a semiconductor structure includes a semiconductor fin comprising an III-V compound, a functional gate structure straddles a portion of the semiconductor fin, and a semiconductor channel material having electron mobility greater than silicon and comprising a different semiconductor material than the semiconductor fin is located beneath the functional gate structure. A doped semiconductor is located on each side of the functional gate structure.

Growing a semiconductor material such as III-V on a silicon sidewall of a mandrel has been shown to be a promising method to grow defect-free III-V material on silicon.

SUMMARY

The present disclosure provides methods of forming patterning features in a semiconductor structure by first forming a plurality of mandrels over a dielectric layer, which mandrels are later removed after supporting the epitaxial growth of semiconductor fin channels.

One aspect is directed to methods of fabricating a semiconductor structure comprising removing mandrel elements, the side walls of which support semiconductor fin structures, which mandrel elements are formed by removing portions of each of a plurality of elongated mandrels outside their coverage by a sacrificial gate, wherein the mandrel elements are removed after removing the sacrificial gate structure.

Another aspect relates to a method of forming a semiconductor structure comprising forming a plurality of elongated mandrels, each covered by a cap layer, on a dielectric layer and a plurality of spaced apart sacrificial gates perpendicular to the elongated mandrels, thereby covering a middle portion of each of the elongated mandrels; forming source and drain regions on the portions of the elongated mandrels outside coverage by the sacrificial gate structure and optional first spacer walls; forming permanent second spacer walls on side walls of the sacrificial gates, or the optional first spacer walls thereon, after forming the source and drain regions and them optionally obtaining further growth of the source and drain regions on opposing sides of the sacrificial gate structure. The method further comprises forming a plurality of mandrel elements by removing portions of each of the plurality of elongated mandrels outside their coverage by the plurality of sacrificial gates; growing semiconductor fin structures on the plurality of mandrel elements; removing the sacrificial gate structures; and removing the mandrel elements after removing the sacrificial gate structures, thereby leaving the semiconductor channel fins unsupported in vertical extent. The method further comprises forming a functional gate structure in the space once occupied by the sacrificial gate structure after removing the mandrel elements.

Another aspect comprises an intermediate structure that can be used in the above methods of fabricating a semiconductor structure, which intermediate structure comprises: a plurality of mandrel elements, each comprising four vertical side walls and a cap layer, formed from each of a plurality of elongated mandrels, wherein portions of the elongated mandrels have been removed in the direction of the elongated mandrels; a plurality of fin channel structures in direct physical contact with the side walls of the mandrel elements that are parallel to the direction of the elongated mandrels; source regions and drain regions on opposing sides of the fin channel structures, in the direction of the elongated mandrels, comprised of III-V semiconductor material; wherein the source and drain regions are separated from the side walls of the mandrel elements, perpendicular to the direction of the elongated mandrels, by dielectric spacer walls; wherein the bottom most surface of the fin channel structures and the source and drain elements are in direct physical contact with a common dielectric layer on a silicon-containing substrate.

Thus, the present disclosure provides methods, and related structures, of forming patterning features in a semiconductor structure by first forming a plurality of mandrels over a dielectric layer, which mandrels are later removed as described above.

DESCRIPTION OF SEVERAL VIEWS OF THE DRAWINGS

The following detailed description, given by way of example and not intended to limit the present disclosure solely thereto, will best be appreciated in conjunction with the accompanying drawings, wherein like reference numerals denote like elements and parts, in which:

FIG. 4A shows a top plan view depicting one embodiment of forming a first spacer wall along the sides of the sacrificial gates in the structure of FIG. 3A, in accordance with the present disclosure.

FIG. 4B shows a cross-sectional view of the structure of FIG. 4A in the direction of the elongated mandrels along line b-b.

FIG. 4C shows a second cross-sectional view of the structure of FIG. 4A along the line c-c depicting one embodiment of forming a first spacer wall on the sacrificial gate structure.

FIG. 5A shows a top plan view depicting one embodiment in which lateral-wall III-V source and drain structures have been grown along the sides of the elongated mandrels, outside the sacrificial gates, in the structure of FIG. 4A, in accordance with the present disclosure.

FIG. 5B shows a first cross-sectional view of the structure of FIG. 5A along line b-b in the direction of the gated elongated mandrels.

FIG. 5C shows a second cross-sectional view of the structure of FIG. 5A, slightly displaced from line b-b along line c-c, passing through the lateral walls of a source and drain region on an elongated mandrel.

FIG. 5D shows a third cross-sectional view of the structure of FIG. 5A, perpendicular to the cross-sectional views of FIGS. 5B and 5C, along line d-d, in accordance with the present disclosure.

FIG. 6A shows a top plan view depicting one embodiment in which, after source and drain structures have been grown along the sides of the elongated mandrels outside the sacrificial gate, the portions of the elongated mandrels outside the sacrificial gate have been etched away in the structure of FIG. 5A, in accordance with the present disclosure.

FIG. 6B shows a first cross-sectional view of the structure of FIG. 6A in the direction of, but slightly displaced from, the elongated lateral-wall III-V source and drain structures along line b-b.

FIG. 6C shows a second cross-sectional view of the structure of FIG. 6A through the elongated lateral-wall III-V source and drain structures along line d-d FIG. 6D shows a third cross-sectional view of the structure of FIG. 6A, perpendicular to the cross-sectional views of FIGS. 6B and 6C, along the line d-d depicting an embodiment in which, after source/and drain lateral-wall structures has been grown along the sides of the mandrels outside the sacrificial gate, the portions of the elongated mandrels outside the gates have been etched away, in accordance with the present disclosure.

FIG. 7A shows a top plan view depicting one embodiment in which second spacer walls are deposited and formed on the first spacer walls of the sacrificial gates and mandrels elements in the structure of FIG. 6A, in accordance with the present disclosure.

FIG. 7B shows a first cross-sectional view of the structure of FIG. 7A in the direction of the elongated source/drain later walls, but slightly displaced therefrom, along line b-b.

FIG. 7C shows a second cross-sectional view of the structure of FIG. 7A through a lateral-wall III-V source/drain structure along line d-d.

FIG. 7D shows a third cross-sectional view of the structure of FIG. 7A, perpendicular to the cross-sectional views of FIGS. 7B and 7C, along line d-d depicting an embodiment in which a second spacer wall has been deposited on the sacrificial gates and remaining mandrel elements, in accordance with the present disclosure.

FIG. 8A shows a top plan view depicting one embodiment in which more source and drain material is grown on the structure of FIG. 7A, in accordance with the present disclosure.

FIG. 8B shows a first cross-sectional view of the structure of FIG. 8A, perpendicular to the sacrificial gate structures along line b-b.

FIG. 8C shows a second cross-sectional view of the structure of FIG. 8A, perpendicular to the sacrificial gate structures along line c-c, slightly displaced from line b-b.

FIG. 8D shows a third cross-sectional view of the structure of FIG. 8A perpendicular to cross-sectional views FIGS. 8B and 8C along line d-d depicting one embodiment in which more source and drain has been grown, in accordance with the present disclosure.

FIG. 9A shows a top plan view depicting an embodiment fabricated after the structure of FIG. 8 has been planarized with a dielectric layer, in accordance with the present disclosure.

FIG. 9B shows a first cross-sectional view of the structure of FIG. 9A perpendicular to the sacrificial gate structures along line b-b.

FIG. 9C shows a second cross-sectional view of the structure of FIG. 9A perpendicular to the sacrificial gate structures along line d-d, slightly displaced from the cross-section along line b-b.

FIG. 9D shows a third cross-sectional view of the structure of FIG. 9A, perpendicular to cross-sectional views FIGS. 9B and 9C, along line d-d depicting one embodiment in which the structure of FIG. 8A has been planarized with a dielectric layer.

FIG. 10A shows a top plan view depicting one embodiment in which the sacrificial gates in the structure of FIG. 9A are removed, in accordance with the present disclosure.

FIG. 10B shows a first cross-sectional view of the structure of FIG. 10A in the direction of the series or row of mandrel elements along line b-b.

FIG. 10C shows a second cross-sectional view of the structure of FIG. 10A along line c-c, slightly displaced from the cross-sectional view along line b-b.

FIG. 10D shows a third cross-sectional view of the structure of FIG. 10A, perpendicular to cross-sectional views FIGS. 10B and 10C, along line d-d depicting one embodiment in which the sacrificial gates are removed.

FIG. 11A shows a top plan view depicting one embodiment in which the first spacer wall is removed from the structure of FIG. 10A, in accordance with the present disclosure.

FIG. 11B shows a first cross-sectional view of the structure of FIG. 11A along b-b through a series of still remaining mandrel elements.

FIG. 11C shows a second cross-sectional view of the structure of FIG. 11A along d-d, slightly displaced from line b-b.

FIG. 11D shows a third cross-sectional view of the structure of FIG. 11A, perpendicular to cross-sectional views of FIGS. 11B and 11C along line d-d depicting one embodiment in which the first spacer walls are removed from the previous structure of FIG. 10A, in accordance with the present disclosure.

FIG. 12A shows a top plan view depicting one embodiment in which semiconductor fin channels are grown on side wall of the remaining (non-etched) mandrel elements in the previous structure of FIG. 11A, in accordance with the present disclosure.

FIG. 12B shows a first cross-sectional view of the structure of FIG. 12A through a series of mandrel elements along line b-b.

FIG. 12C shows a second cross-sectional view of the structure of FIG. 12A along line c-c, slightly displaced from line b-b.

FIG. 12D shows a third cross-sectional view of the structure of FIG. 12A, perpendicular to cross-sectional views of FIGS. 11B and 11C, along line d-d depicting one embodiment in which semiconductor fin channels are grown on the side walls of the mandrel elements, in accordance with the present disclosure.

FIG. 13A shows a top plan view depicting one embodiment in which the remaining mandrel elements have been removed from the previous structure of FIG. 12A, in accordance with the present disclosure.

FIG. 13B shows a first cross-sectional view of the structure of FIG. 13A along line b-b parallel to the semiconductor fin channels.

FIG. 13C shows a second cross-sectional view of the structure of FIG. 13A along line c-c, through the semiconductor fin channels, slightly displaced from line b-b.

FIG. 13D shows a third cross-sectional view of the structure of FIG. 13A, perpendicular to cross-sectional views of FIGS. 13B and 13C, along line d-d depicting one embodiment in which remaining mandrels elements have been removed, in accordance with the present disclosure.

FIG. 14A shows a top plan view depicting one embodiment in which real gates and gate dielectric layers are deposited and the structure planarized in the previous structure of FIG. 13A, in accordance with the present disclosure.

FIG. 14B shows a first cross-sectional view of the structure of FIG. 14A parallel to the semiconductor fin channels along line b-b.

FIG. 14C shows a second cross-sectional view along line c-c, through the semiconductor fin channels, slightly displaced from line b-b.

FIG. 14D shows a third cross-sectional view of the structure of FIG. 14A, perpendicular to cross-sectional views of FIGS. 14B and 14C, along line d-d, depicting one embodiment in which real gates and gate dielectric layers are deposited and the structure planarized, in accordance with the present disclosure.

DETAILED DESCRIPTION

Figure 1A:
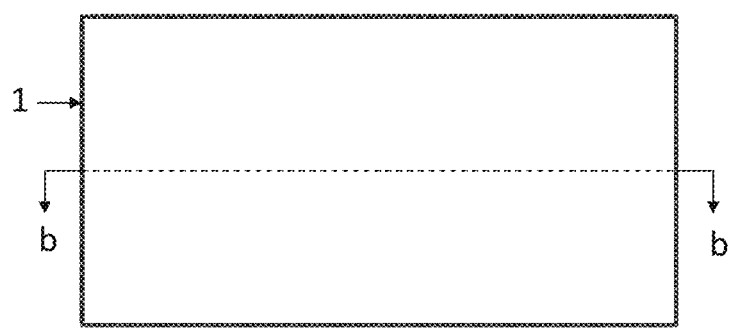
FIG. 1A shows a top plan view of a semiconductor substrate having a semiconductor layer that is present on a buried oxide dielectric layer, as used in accordance with one embodiment of the present disclosure.

As discussed above, growing a semiconductor material such as III-V on a silicon sidewall of a mandrel has been shown to be a promising method to grow defect-free III-V material on silicon. Removing the mandrel, however, can cause the sidewall fin to collapse, which means that the fin structure needs to be anchored. On the other hand, the need to anchor the fin structure can present a possible density trade-off.

It would be desirable to obtain lateral semiconductor growth that avoids the above-mentioned problems.

Detailed embodiments of the methods and structures of the present disclosure are described herein. However, it is to be understood that the disclosed embodiments are merely illustrative of the disclosed methods and structures that may be embodied in various forms. In addition, each of the examples given in connection with the various embodiments of the disclosure is intended to be illustrative and not restrictive. Further, the figures are not necessarily to scale, and some features may be exaggerated to show details of particular components. Therefore, specific structural and functional details disclosed herein are not to be interpreted as limiting, but merely as a representative basis for teaching one skilled in the art to variously employ the methods and structures of the present disclosure. For the purposes of the description hereinafter, the terms "upper", "lower", "top", "bottom", and derivatives thereof shall relate to the disclosed structures, as they are oriented in the drawing figures. The same numbers in the various figures refer to the same structural component or, in some cases, part thereof.

The methods and structures disclosed herein provide semiconductor structures such as in multi-gate devices including fin field effect transistors (FinFETs). As used herein, the term "fin structure" refers to a semiconductor material, which is employed as a body of a multi-gate semiconductor device, with respect to which a gate structure is positioned at least partly around.

FIGS. 1 to 14 depict one embodiment of a method of progressively fabricating FinFET structures 1 to 14, e.g., a p-type FinFET having fin structures 42 as shown in FIG. 14A.

Figure 1B:
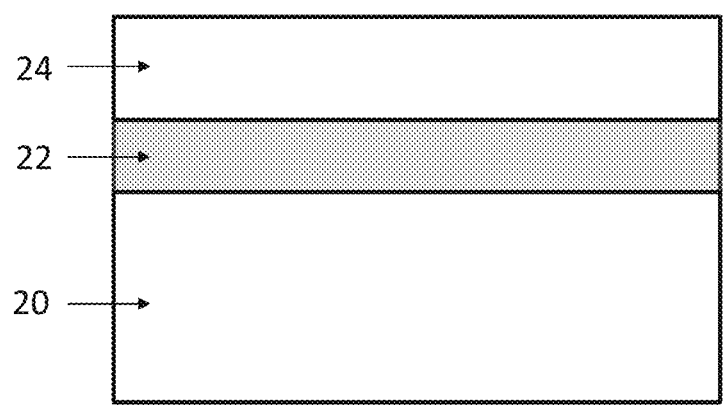
FIG. 1B shows a cross-sectional view through line b-b of the semiconductor substrate of FIG. 1A having a semiconductor layer that is present on a buried oxide dielectric layer, as used in accordance with one embodiment of the present disclosure.

Beginning with FIG. 1, structure 1 depicts one embodiment of a semiconductor substrate having a semiconductor layer 24 that is present on a dielectric layer 22, e.g., buried dielectric layer. In some embodiments, the semiconductor layer 24 is a layer of silicon that is present on a buried dielectric layer 22 and the dielectric layer 22 is present on a base semiconductor layer 20, for example, made from silicon. The semiconductor substrate 1 can comprise a silicon-on-insulator (SOI) substrate or a germanium-on-insulator (GOI) substrate.

The semiconductor layer 24 can be composed of silicon and can be used for forming the elongated mandrels to be described. In turn, elements of the elongated mandrels can be used to grow IIV-V semiconductor walls. The semiconductor layer 24 can be a semiconducting material including, but not limited to Si, strained Si, SiC, SiGe, SiGeC, Si alloys, Ge, Ge alloys, GaAs, InAs, InP as well as other III/V and II/VI compound semiconductor materials. In some embodiments, the semiconductor layer 24 can be composed of silicon germanium (SiGe) or germanium (Ge).

The semiconductor layer 24 can be a single layer having a thickness ranging from 5 nm to 150 nm, specifically 20 to 60 nm, more specifically 30 to 50 nm. The semiconductor layer 24 can be present on, e.g., in direct contact with, the dielectric layer 22 (also referred to as a buried oxide layer). The term "direct contact" means that a first element such as a first structure and a second element such as a second structure are connected without any intermediary conducting, insulating, or semiconductor layers at the interface of the two elements. The dielectric layer 22 can be composed of an oxide, nitride or oxynitride material. For example, when the dielectric layer 22 is composed of an oxide, the dielectric layer 22 can be silicon oxide. In another example, when the dielectric layer is composed of a nitride, the dielectric layer 22 can be silicon nitride. The dielectric layer 22 can be a single layer having a thickness ranging from 10 nm to 300 nm, specifically 25 to 250 nm, more specifically 100 to 200 nm.

In one embodiment, the semiconductor substrate 1 that is depicted in FIG. 1 can be formed by depositing the buried dielectric layer 22 on the base semiconductor or silicon substrate layer 20 and then depositing the semiconductor layer 24 on the buried dielectric layer 22. The semiconductor substrate 1 depicted in FIG. 1 can also be formed by wafer bonding methods. In yet another embodiment, as mentioned above, the structure of FIG. 1 can be a silicon-on-insulator (all) substrate.

Figure 2A:
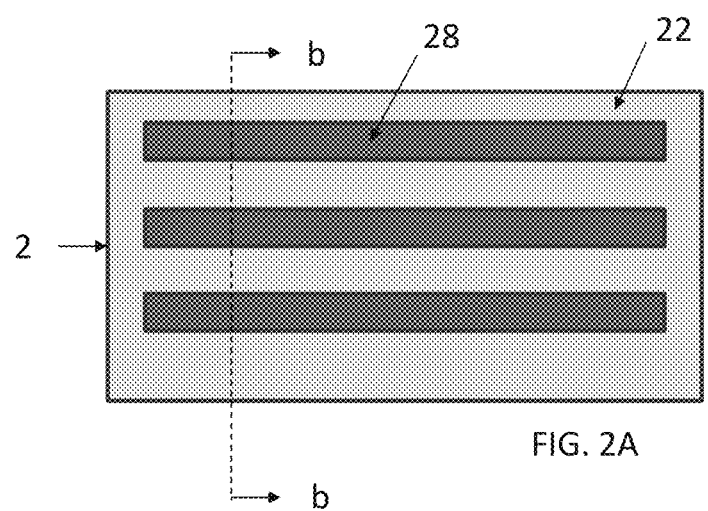
FIG. 2A shows a top plan view depicting one embodiment of making the semiconductor substrate of FIG. 1 after blanketing it with a hard mask and patterning the hard mask and semiconductor layers to provide a plurality of substantially parallel elongated mandrel structures each having a cap layer, in accordance with one embodiment of the present disclosure.

Referring to a subsequent step in methods of fabricating FinFETs, a hard mask layer (not shown) can be blanketed over the semiconductor layer 24 and then patterned along with the semiconductor layer to form a cap layer 28. FIG. 2A shows a top plan view and a side cross-sectional views of structure 2 depicting one embodiment of patterning etching the semiconductor substrate of FIG. 1, after blanketing the top layer with a hard mask layer, to provide a plurality of substantially parallel elongated mandrel structures 30, in accordance with one embodiment of the present disclosure. In some embodiments, the thickness of the hard mask layer can be 2 to 20 nm, specifically 5 to 15 nm, more specifically 8 to 12 nm.

In some embodiment, the etching of the semiconductor layer 24 and hard mask layer can be accomplished by crystallographic wet etch or RIE etching. Other directional patterning means can be used, as will be appreciated by the skilled artisan.

Figure 2B:
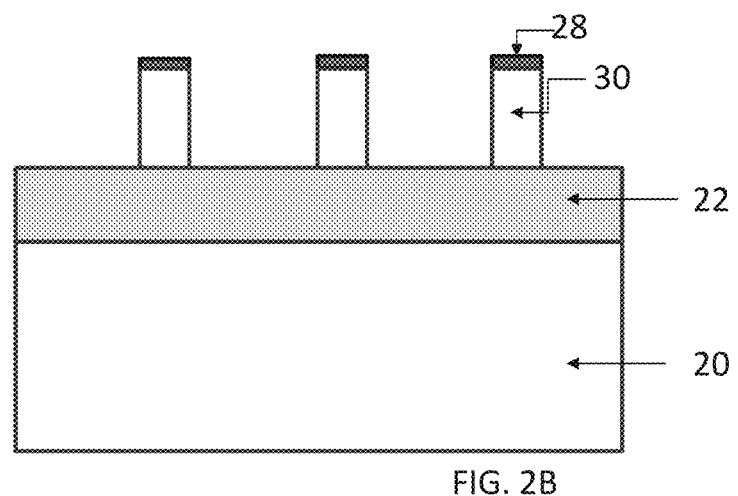
FIG. 2B shows a side cross-sectional view through line b-b of the structure of FIG. 2A.

FIG. 2B shows a side cross-sectional view depicting the etched semiconductor structure 1 of FIG. 2A, wherein the hard mask becomes a cap layer 28 on top of the each of the parallel elongated mandrel structures 30, in accordance with one embodiment of the present disclosure. As evident from the embodiment of FIGS. 2A and 2B, etching the semiconductor structure 1 provides a selected region including elongated mandrel structures 30, each of which is topped by a hard mask material to form a cap layer 28 on each mandrel, wherein the lower surface is now the exposed (no longer buried) dielectric layer 22.

The term "mandrel" denotes a sacrificial structure at least elements of which can provide the deposition surface of a later formed fin structure. The mandrel structures 30 typically have a width W2 that is larger than the width W1 of a later channel fin structure (i.e. fin 42 of FIGS. 12A to 14A. For example, in one embodiment, the width W2 of the elongated mandrel structure 30 can range from 15 nm to 45 nm, specifically 20 to 30 nm, and the width W1 of each of the FET fin structures can range from 2 nm to 12 nm. In another embodiment, the width W2 of the mandrel structures 30 can range from 20 nm to 40 nm and the width W1 of the FET fin structures grown on the walls of elements thereof can range from 5 nm to 10 nm.

In view of the above, the hard mask layer and, hence, the dielectric cap layer 28 of FIG. 2B can be composed of an oxide, nitride or oxynitride layer. For example, the dielectric cap layer 28 can be composed of silicon oxide or silicon nitride. The dielectric cap layer 28 can have a thickness ranging from 2 nm to 200 nm. In another embodiment, the dielectric cap layer 28 can have a thickness ranging from 5 nm to 100 nm.

The hard mask layer material for forming the dielectric cap layer 28 can be formed by a deposition or forming method that is selected from the group consisting of chemical vapor deposition (CVD), chemical solution deposition, thermal growth, spin on deposition or a combination thereof.

In particular, following the formation of the hard mask layer over the semiconductor layer 24, the patterning of the hard mask layer and the semiconductor layer 24 of the substrate structure 1, can comprise, in one embodiment, etching the stacked hard mask layer and the semiconductor layer 24, including forming a patterned photoresist layer, i.e., photomask, on the hard mask layer and over semiconductor layer 24, and etching the two stacked layers selectively to the photomask to the level of the buried dielectric layer 22, thereby exposing the same. Specifically, in one embodiment, a pattern is produced by applying a photoresist to the surface to be etched, exposing the photoresist to a pattern of radiation, and then developing the pattern into the photoresist utilizing a resist developer. Once the patterning of the photoresist is completed, the sections of the two stacked layers covered by the photoresist are protected to provide the elongated mandrel structures 30 each with a cap layer 28, while the exposed regions are removed down to the buried dielectric layer 22 using the selective etching process.

As used herein, the term "selective" in reference to a material removal process denotes that the rate of material removal for a first material is greater than the rate of removal for at least another material of the structure to which the material removal process is being applied. For example, in one embodiment, a selective etch can include etch chemistry that removes a first material selectively to a second material by a ratio of 10:1 or greater.

The etch process for forming the elongated mandrel structures 30 can be anisotropic. An anisotropic etch process is a material removal process in which the etch rate in the direction normal to the surface to be etched is greater than in the direction parallel to the surface to be etched. Such an anisotropic etch can include crystallographic wet etch or reactive-ion etching (RIE). Other examples of anisotropic etching that can be used include ion beam etching, plasma etching, or laser ablation.

Each of the elongated mandrel structures 30 in FIG. 2A can have a height equal to the combined thickness of the semiconductor layer 24 and the cap layer 28, for example ranging from 7 nm to 200 nm, specifically 10 nm to 100 nm, more specifically 15 nm to 50 nm. Adjacent elongated mandrel structures 30 can be separated by a pitch P1 ranging from 10 nm to 100 nm. In one embodiment, adjacent elongated mandrel structures 30 can be separated by a pitch P1 ranging from 15 nm to 60 nm, specifically 25 to 50 nm.

Figure 3A:
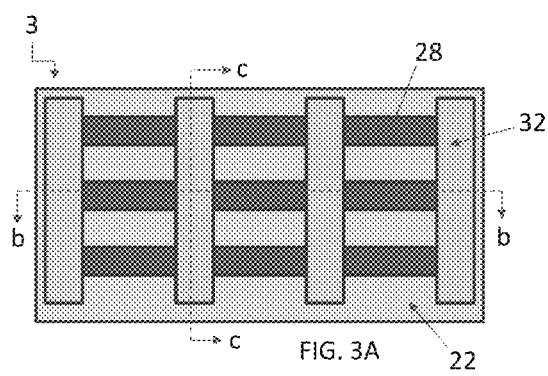
FIG. 3A shows a top plan view depicting one embodiment of forming a sacrificial gate over a portion of each of the elongated mandrels in the structure of FIG. 2A, in accordance with the present disclosure.

FIG. 3A depicts one embodiment of forming sacrificial gate structures 32 over the middle portions of the elongated mandrel structures 30 in structure 2A. The sacrificial gate structures 32 can be made of a dielectric material such as amorphous carbon, a porous oxide, or the like, since the sacrificial gates, by definition, are eventually removed in their entirely after serving their intermediate function during the disclosed fabrication.

The sacrificial gate structures 32 can be formed using deposition, photolithography, and etch processes. For example, the material layer for the sacrificial gate structures can be deposited over the elongated mandrel structures 30 (and cap layers). Thereafter, the material layer can be patterned and etched to provide the sacrificial gate structures 32 as seen in FIG. 3A.

Figure 3C:
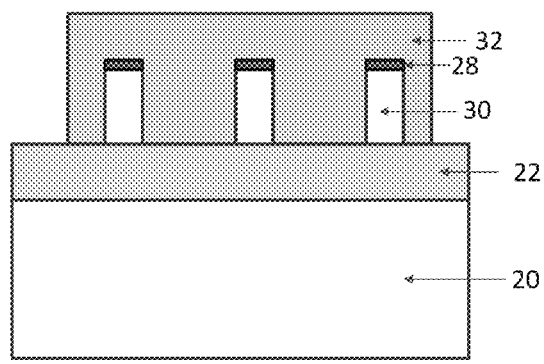
FIG. 3C shows a second cross-sectional view of the structure of FIG. 3A along line c-c of FIG. 3A depicting one embodiment of forming a sacrificial gate structure over a middle portion of the mandrels.
Figure 3B:
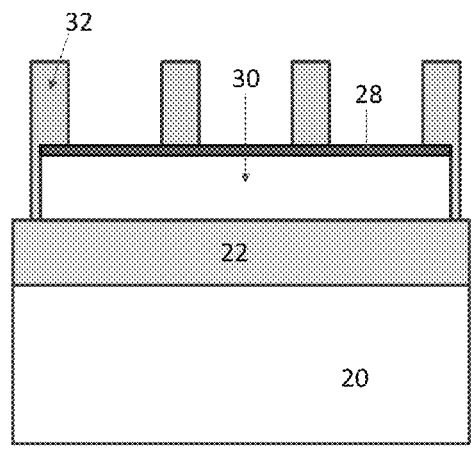
FIG. 3B shows a cross-sectional view of the structure of FIG. 3A in the direction of the elongated mandrels along line b-b.

Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections of the material for the sacrificial gate structures 32 that are covered by the photoresist are protected to provide the sacrificial gate structures 32, while the exposed regions are removed using a selective etching process that removes the unprotected regions. Following formation of the sacrificial gate structures 32, the photoresist can be removed. FIGS. 3B and 3C show the patterned sacrificial gates in cross-sections, one perpendicular to the other, as indicated in the FIGS.

FIGS. 4A, B, and C show a top plan view and two cross-sectional views, respectively, the view of FIG. 4B in the direction of, and through, an elongated mandrel along line b-b and the view of FIG. 4C perpendicular to the cross-sectional view of FIG. 4A through a sacrificial gate 32. FIGS. 4A, B, and C further show formation of optional first spacer walls 34 formed on the side walls of sacrificial gate structures 32, in accordance with the present disclosure. The first spacer walls 34 can be an oxide deposited selectively on the walls of the sacrificial gate structures 32 at a thickness of 1 to 20 nm, specifically 5 to 15 nm, more specifically 8 to 12 nm. The optional first spacer walls 34 can allow some space between the source/drain regions, to be formed, and the sacrificial gate in order to isolate the sacrificial gate during subsequent processing steps. The first spacer wall itself is not itself functional in the final semiconductor structure used in an electronic device and eventually can be removed in its entirety, as discussed below.

The first spacer walls 34 can be deposited, for example, by CVD or like depositional processes. Variations of CVD can include, but are not limited to, APCVD, LPCVD, PECVD, MOCVD, ALD, and combinations thereof.

FIG. 5A depicts one embodiment of forming III-V source and drain structures 36 on the side walls of the elongated mandrel structures 30 outside the first spacer walls and sacrificial gates. The term "III-V semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present invention include, but are not limited to, alloys of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof.

In some embodiments, the III-V semiconductor structures 36 can be formed on the mandrel structures 30 using an epitaxial deposition process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the mandrel structure (a semiconductor material such as silicon or silicon germanium) with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon oxide or silicon nitride surfaces. Therefore, in some embodiments, because the epitaxially grown III-V semiconductor structures 36 are not formed on dielectric structures, such as the dielectric cap layer 28, the dielectric layer 22, or the first spacer walls 34 that are present in the structure 5 of FIG. 5, the epitaxially grown III-V semiconductor wall structures 36 can be selectively deposited on the side walls of the mandrel structures 30.

Examples of various epitaxial growth process apparatuses that are suitable for use with the present disclosure include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE), and Metalorganic chemical Vapor Deposition (MOCVD). The temperature for a epitaxial deposition process for forming the III-V wall structures 36 typically can range from 550° C. to 900° C. Although higher temperature typically results in faster deposition, the faster deposition can result in crystal defects and film cracking.

In one embodiment, each of the III-V semiconductor wall structures 36 can have a width W3 ranging from 2 nm to 200 nm. In another embodiment, each of the III-V semiconductor wall structures 36 can have width W3 ranging from 5 nm to 25 nm. FIGS. 5B, C, and D show cross-sections of the structure 5 of FIG. 5A. As evident by FIGS. 5B and 5C, the III-V wall structures 36 are grown on the side walls of the elongated mandrels 30 but not on the cap layers 28, nor (as shown in FIG. 5D) on the sacrificial gates 32, first spacer walls 34, or dielectric layer 22.

FIG. 6A depicts an embodiment involving removing portions of the mandrel structures 30 outside the sacrificial gates to form structure 6. Such portions of the mandrel structures 30 can be removed by etching that is selective to the III-V semiconductor wall structures 36. The etching for removing portions of the mandrel structures 30 can also be selective to the sacrificial gate structures 32. The dielectric cap layers 28 that are present on the mandrel structures (outside the sacrificial gate) can be removed before removing the portions of the mandrel structures 30 by a directional etching process. Specifically, the etch process for removing portions of the mandrel structures 30 not covered by the sacrificial gate can be an anisotropic etch, such as reactive ion etch (RIE), or the etch process can be an isotropic etch such as a wet chemical etch. In one example, a wet etch composed of $H_3PO_4$ can be used to remove dielectric cap layers 28 composed of silicon nitride, and a wet etch composed of $NH_4/H_2O_2$ can be used to remove portions the mandrel structures 30 composed of silicon or germanium where not covered by the sacrificial gate structure.

In one embodiment, the process of removing the indicated portions of mandrel structures 30 and dielectric cap layers 28 includes patterning a photoresist layer to cover the region of structure 6 that corresponds to III-V semiconductor wall structures 36 and removing the dielectric cap layers 28 with a wet etch of hydrofluoric (HF) acid that is selective to oxide or by a reactive ion etch process. Thereafter, the patterned photoresist layer can be removed. The exposed mandrel structures 30 can then be removed using a selective wet etch or plasma etching such as $XeF_2$. FIGS. 6 B, C and D show cross-sections of the structure of FIG. 6A showing the effect of the etching in cross-section, most clearly seen in FIG. 6B, whereas the views of FIGS. 6C and 6D remain unchanged from before etching of the mandrel.

FIG. 7A depicts forming a second spacer wall 38, which will be of particular later use after removal of the optional first spacer wall. The second spacer wall can be a different material than the optional first spacer wall. Specifically, the second spacer wall can be composed of the same material as the cap layers 28. FIG. 7A shows a top plan view, and FIGS. 7B and 7C shows a cross-sectional view in the direction of the III-V semiconductor walls, in which the second spacer walls 38 are seen having formed over first spacer walls on the sacrificial gate and over the walls of the remaining mandrel elements 31 but not on the top of the sacrificial gate or III-V semiconductor walls. Perpendicular to the cross-sectionals views of FIGS. 7B and 7C, a third cross-sectional view along the line d-d of FIG. 7A shows the second spacer wall 38 covering the optional first spacer wall 34 on the sacrificial gate structures, in accordance with the present disclosure. It may be noted that first and second spacer walls shown in FIG. 7D are not shown (omitted) in FIG. 7A at the ends of the sacrificial gates, as in the cross-sectional views of FIGS. 4-14 along lines d-d, in order to simplify the drawings.

The second spacer walls 38 can be a nitride material such as silicon nitride, a low-k material, which can be deposited on the first spacer walls at similar thickness, for example, a thickness of 1 to 20 nm, specifically 5 to 15 nm, more specifically 8 to 12 nm. The second spacer walls 38 can allow some space between the source/drain regions and the real gate to be formed during subsequent process steps. Thus, second spacer walls 38 can remain in the final fabricated electronic device. The second spacer walls 38 can be deposited, for example, by CVD or like depositional processes as described above.

FIG. 8A depicts a structure 8 showing further growth, specifically optional merging, of the source or drain wall structures of FIG. 7A. When merged, the source/drain regions can cover most or all of the area between the sacrificial gate or spacer wall thereon. The source/drain regions can be further grown epitaxially as described earlier. The views of FIGS. 8C and 8D remain unaffected. However, FIG. 7B shows the further growth of the source/drain in FIG. 7A. It is also possible not to merge the source/drain regions to allow contact to the bottom of FIN.

Subsequently to growing more of the source/drain, Structure 8 of FIG. 8A can be planarized with a dielectric layer 40, as will be appreciated by the skilled artisan, as shown in FIGS. 9A, B, C, and D. FIG. 9A shows a top plan view that omits the dielectric layer in order to show underlying features of structure 9. However, FIGS. 9B and 9C show a first and second cross-sectional view perpendicular to the sacrificial gate structure in 32 along lines b-b and c-c, respectively, in which the planarized dielectric 40 is evident. A third cross-sectional view FIG. 9D, parallel to the sacrificial gate structure along line d-d, also shows the planarized dielectric layer 40.

FIG. 10A depicts removal of the sacrificial gates 32 from structure 9 of FIG. 9A, resulting in a modified structure 10 shown in top plan view. A first cross-sectional view shown in FIG. 10B, along line b-b, and a second cross-sectional view, shown in FIG. 10C along line d-d, both clearly show removal of the sacrificial gates compared to FIGS. 9 A through D. The third cross-sectional view of FIG. 10D along the line d-d shows the remaining mandrel elements 31, each with a cap layer 28, in an exposed position to support a fin structure in accordance with the present disclosure.

The sacrificial gate structure can be removed [How? Please explain] by etching. The etchant use will depends on the sacrificial gate material. For example, if the sacrificial gate is a-Silicon, then wet etch/RIE that etch silicon can be employed. If the sacrificial gate consist of a-Carbon, then wet etch/RIE that etch a-Carbon can be employed FIGS. 11A, B, and C depict structure 11 after selective removal of the first spacer wall of previous structure 10, which selective removal can be accomplished, for example, by using an anisotropic wet etch such as diluted hydrofluoric acid (HF).

FIGS. 12A, B, C, and D depict a structure 12, after removing the sacrificial gates 32 from structure 11 of FIG. 11A, thereby exposing the remaining mandrel elements 3 leach with cap layers 28, wherein a fin structure has been grown on the side walls of the remaining mandrel elements. The semiconductor fin or channel can be a p-type material, for example, p-doped InGaAs for making an NMOSFET.

FIG. 12A shows a top plan view and FIG. 12B shows a first cross-sectional view along line b-b. The second cross-sectional view of FIG. 12C along line c-c is taken through a fin. Perpendicular to cross-sectional views of FIGS. 12B and 12C, the third cross-sectional view of FIG. 12 D along the line d-d clearly shows the semiconductor fin channels 42 that are grown on, and supported by, the side walls of the remaining (non-etched) mandrels 30, in accordance with the present disclosure.

The intermediate structure 12 of FIG. 12A can be considered as representative of some embodiments of methods of fabricating a fin field effect transistor. In particular, the structure 12 comprises a plurality of mandrel elements 31, each comprising four vertical side walls and a cap layer, formed from each of a plurality of elongated mandrels 30 as previously described, wherein portions of the elongated mandrels have been removed in the direction of the elongated mandrels. Structure 12 further comprises a plurality of fin channel structures in direct physical contact with the side walls of the mandrel elements 31 that are parallel to the direction of the elongated mandrels or rows of mandrel elements and, furthermore, source regions and drain regions on opposing sides of the fin channel structures 42, in the direction of the rows of mandrels, comprised of III-V semiconductor material. The source and drain regions are separated from the side walls of the mandrel elements, perpendicular to the direction of the rows of mandrels elements, by dielectric spacer walls. As seen in FIG. 12A, the bottom most surface of the fin channel structures and the source and drain elements can be in direct physical contact with a common dielectric layer on a silicon-containing substrate.

Subsequent to growing the semiconductor fin channels 42, the mandrel elements 31 (each with cap layer 28) of structure 12 in FIG. 12A can be removed to form structure 13 in FIG. 13A. FIG. 13A shows a top plan view of structure 13 and a first cross-sectional view (FIG. 13B) along line b-b. The second cross-sectional view of FIG. 13C does not change from that of the previous structure. Perpendicular to the cross-sectional views of FIGS. 13B and C, the third cross-sectional view of FIG. 13D along the line d-d of FIG. 13A also clearly depicts the removal of the mandrel elements supporting the semiconductor fin channels 42 grown on the side walls thereof, in accordance with the present disclosure. It should be noted that the semiconductor fin channels 42 are connected to the source and drain regions 36 under the second spacer walls 34.

After the fin channels 42 are left free-standing, neither supported by mandrel elements nor necessarily anchored, real (functional) gates and gate dielectrics can be deposited over the fin channel structures 42. In one embodiment, as shown in FIGS. 14A, B, C, and D, a gate structure 44 includes at least two layers (not shown in FIG.) and comprises at least one gate dielectric layer and at least one gate conductor layer, as will be appreciated by the skilled artisan. The at least one gate dielectric layer is typically formed on the channel portion of the III-V fin structures 42. The at least one gate dielectric layer can be composed of any dielectric material including oxides, nitrides and oxynitrides. In one embodiment, the at least one gate dielectric layer can be provided by a high-k dielectric material. The term "high-k" as used to describe the material of the at least one first gate dielectric layer denotes a dielectric material having a dielectric constant greater than silicon oxide ($SiO_2$) at room temperature (20° C. to 25° C.) and atmospheric pressure (1 atm). For example, a high-k dielectric material can have a dielectric constant greater than 4.0. In another example, the high-k gate dielectric material has a dielectric constant greater than 7.0.

In one embodiment, the gate dielectric layer is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the gate dielectric layer can include hafnium silicate, hafnium silicon oxynitride, or combinations thereof.

In one embodiment, the gate dielectric layer can be deposited by chemical vapor deposition (CVD). Variations of CVD processes suitable for depositing the gate dielectric layer are described above. In one embodiment, the thickness of the gate dielectric layer is greater than 0.8 nm to 10 nm, specifically about 1.0 nm to about 6.0 nm.

The at least one gate conductor layer is formed on the at least one gate dielectric layer (shown merged in FIGS. 14A, B, C, and D to form overall gate structure 44). The at least one gate conductor layer of structure 44 can be formed by a deposition process, such as CVD, plasma-assisted CVD, plating, and/or sputtering, followed by planarization. In one embodiment, the at least one gate conductor layer is composed of metal or a doped semiconductor. Examples of metals that can be employed for the at least one gate conductor layer can include, but is not limited to, W, Ni, Ti, Mo, Ta, Cu, Pt, Ag, Au, Ru, Jr, Rh, and Re, Al, TiN, WN, TaN, TiAlN, TaAlN, and alloys thereof. One example of a doped semiconductor that is suitable for the at least one gate conductor layer is doped polysilicon.

Subsequent to deposition of the real gate dielectric and real gate conductor to form the gate structure 44 of FIG. 14A, the intermediate structure can then be planarized with a dielectric layer to electrically isolate the structure. It can be noted that the planarized dielectric layer of FIG. 14D is omitted from FIG. 14A in order to show underlying features.

In some embodiments, in which a FinFET is fabricated that is an n-type FinFET, the gate conductor layer can include a metal that is an n-type work function metal layer. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer can range from 4.1 eV to 4.3 eV. In one embodiment, the n-type work function metal layer is composed of at least one of TiAl, TanN, TiN, HfN, HfSi, or combinations thereof. The n-type work function metal layer can be deposited using chemical vapor deposition (CVD), atomic layer deposition (ALD), sputtering or plating. In one embodiment, the n-type work function metal layer is composed of titanium aluminum (TiAl) and is deposited using sputtering. Examples of sputtering apparatus that can be suitable for depositing the n-type work function metal layer include DC diode type systems, radio frequency (RF) sputtering, magnetron sputtering, and ionized metal plasma (IMP) sputtering. In one example, an n-type work function metal layer composed of TiN is sputtered from a solid titanium target, in which the nitrogen content of the metal nitride layer is introduced by a nitrogen gas. In another example, an n-type work function metal layer composed of TiN is sputtered from a solid target comprised of titanium and nitrogen. In addition to physical vapor deposition (PVD) techniques, the n-type work function metal layer may also be formed using chemical vapor deposition (CVD) and atomic layer deposition (ALD). The gate structure 44 can be formed using deposition, photolithography and etch processes.

As shown in FIGS. 14A, B, C, and D, the gate structures 44 are each formed on channel portions of the fin structures 42. For example, the material layers for the gate dielectric layer and the gate conductor layer can be deposited onto the fin structures to provide a gate stack. Thereafter, the gate stack can be patterned and etched to provide the gate structure 44.

Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections of the stack of the gate dielectric layer and the gate conductor layer covered by the photoresist are protected to provide the gate structure 44, while the exposed regions are removed using a selective etching process that removes the unprotected regions. For example, the portion of the gate dielectric layer and the gate conductor layer that is present over other areas of the structure 14 can be removed and, following formation of the gate structure 44, the photoresist can be removed.

In some embodiments of the above process, exposed portions of semiconductor structures can be doped to provide source and drain extension regions, either after forming the structures or while forming the structures in the first place. The source and drain extension regions formed can be p-type doped to provide a p-type conductivity fin field effect transistor or the source and drain extension regions to the III-V fin structures can be n-type doped to provide an n-type conductivity fin field effect transistor. In some embodiments, in which the first conductivity FinFET that is formed is a p-type FinFET, the gate conductor layer can include a metal that is a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

FIGS. 1-14, as described above, depict a "mandrel removal later" process. A "mandrel removal later" process can include removing the mandrel elements that support the semiconductor fin structures after removing a sacrificial gate structure and after forming a source/drain structure outside the sacrificial gate structure. Spacer walls on the side walls of each of the sacrificial gate structures can be used before completing the growth of the source and drain regions on opposing sides of the sacrificial gate structures. After removing the sacrificial gate structures, a functional gate structure can be formed in the space once occupied by the sacrificial gate structure. Thus, a sacrificial gate structures can include sacrificial material that defines the geometry of a later formed functional gate structure that actually functions to switch the semiconductor device from an "on" to "off" state, and vice versa.

While the present disclosure has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, the method comprising:
    forming mandrel elements on a substrate that are partially covered by sacrificial gates by removing portions of each of a plurality of elongated mandrels that are exposed, wherein the mandrel elements have sidewalls that support semiconductor fin structures;
    removing the sacrificial gates; and
    removing the mandrel elements after removing the sacrificial gates.

2. The method of claim 1 further comprising, prior to forming the mandrel elements from the elongated mandrels, forming source and drain regions on side walls of portions of the elongated mandrels outside coverage by the sacrificial gates.

3. The method of claim 2, further comprising, after forming the source and drain regions, forming permanent spacer walls on the side walls of each of the sacrificial gates or on temporary spacer walls disposed on the sidewalls of the sacrificial gates thereon.

4. The method of claim 1 further comprising, after removing the mandrel elements, forming functional gate structures in the spaces previously occupied by the sacrificial gates.

5. The method of claim 1, wherein each sacrificial gate defines at least a portion of the geometry of a later formed functional gate structure that, in operation, switches a semiconductor device from an "on" state to an "off" state and vice versa.

6. The method of claim 1, wherein the plurality of elongated mandrels, each with a cap layer, are formed in an SOI substrate by blanketing the top semiconductor layer with a hard mask layer and selectively patterning the hard mask layer and the semiconductor layer, wherein the semiconductor layer forms a plurality of parallel elongated mandrels and the hard mask layer forms a cap layer on each elongated mandrel.

7. The method of claim 6, wherein the sacrificial gates are deposited and patterned over the elongated mandrels in a perpendicular direction to the plurality of elongated mandrels.

8. The method of claim 7, wherein the sacrificial gates comprise amorphous carbon or a porous oxide.

9. The method of claim 7, wherein subsequently source and drain regions, on opposing sides of each sacrificial gate, are grown on opposing side walls of each elongated mandrel in their direction of elongation.

10. The method of claim 9, wherein portions of each of the elongated mandrels, outside coverage by the sacrificial gates, are etched away to form mandrel elements that each have a cap layer under the sacrificial gates.

11. The method of claim 10, wherein the sacrificial gates are removed after forming the mandrel elements from the elongated mandrels.

12. The method of 1, wherein p-type semiconductor channel fins are grown on the mandrel elements.

13. The method of 12, wherein after forming the channel fins the mandrel elements are removed, leaving the p-type semiconductor channel fins unsupported in vertical extent.

14. The method of 13, wherein functional gate dielectric and functional gate conductor are deposited over the p-type semiconductor channel fins between the spacer walls.

15. A method of forming a semiconductor structure, the method comprising:
    forming a plurality of elongated mandrels, each covered by a cap layer, on a dielectric layer and a plurality of spaced apart sacrificial gates perpendicular to the elongated mandrels, thereby covering a middle portion of each of the elongated mandrels;
    forming source and drain regions on the portions of the elongated mandrels outside coverage by the sacrificial gates;
    after forming the source and drain regions, forming permanent second spacer walls on the side walls of the sacrificial gates or on first spacer walls disposed on the side walls of the sacrificial gates;
    forming a plurality of mandrel elements by removing portions of each of a plurality of elongated mandrels outside their coverage by the plurality of sacrificial gates;
    growing semiconductor fin structures on the plurality of mandrel elements;
    removing the sacrificial gates;
    removing the mandrel elements after removing the sacrificial gates, thereby leaving the semiconductor channel fins unsupported in vertical extent; and
    forming functional gate structures in the spaces previously occupied by the sacrificial gates after removing the mandrel elements.

16. The method of 15, wherein a functional gate dielectric and functional gate conductor are deposited over p-type semiconductor channel fins between the spacer walls.

* * * * *